United States Patent
Lowell et al.

(10) Patent No.: US 8,107,894 B2
(45) Date of Patent: Jan. 31, 2012

(54) MODULAR SOLID-STATE MILLIMETER WAVE (MMW) RF POWER SOURCE

(75) Inventors: Reid F. Lowell, Ontario, CA (US); Kenneth W. Brown, Yucaipa, CA (US); Darin M. Gritters, Yucaipa, CA (US); Andrew K. Brown, Apple Valley, CA (US); Michael J. Sotelo, Chino, CA (US); William E. Dolash, Montclair, CA (US); Travis B. Feenstra, Redlands, CA (US)

(73) Assignee: Raytheon Company, Waltham, MA (US)

( * ) Notice: Subject to any disclaimer, the term of this patent is extended or adjusted under 35 U.S.C. 154(b) by 475 days.

(21) Appl. No.: 12/371,857

(22) Filed: Feb. 16, 2009

(65) Prior Publication Data

US 2010/0210225 A1 Aug. 19, 2010

Related U.S. Application Data

(60) Provisional application No. 61/088,073, filed on Aug. 12, 2008.

(51) Int. Cl.
*H04B 1/38* (2006.01)
(52) U.S. Cl. .......... 455/90.2; 455/103; 343/893
(58) Field of Classification Search .......... 455/103, 455/90.2; 343/893
See application file for complete search history.

(56) References Cited

U.S. PATENT DOCUMENTS

| | | |
|---|---|---|
| 3,818,386 A | 6/1974 | Granberry |
| 4,641,107 A | 2/1987 | Kalokitis |
| 5,218,322 A | 6/1993 | Allison et al. |

(Continued)

FOREIGN PATENT DOCUMENTS

EP 0653801 A1 5/1885

(Continued)

OTHER PUBLICATIONS

Delisio, Quasi optical and spatial power combining, Mar. 2002.

(Continued)

*Primary Examiner* — Quan Tra
(74) *Attorney, Agent, or Firm* — Eric A. Gifford

(57) ABSTRACT

A modular solid-state MMW power source based on a topology of the lens array amplifier provides both the flexibility to scale output power and effective thermal management. The modular power source includes a single submodule that uses one or more power dividers and one or more solid-state amplification stages to divide and amplify an RF input signal into R amplified RF signals. The submodule is mounted (suitably in the X-Y plane) on the surface of a heat sink, suitably coupled to a cold backplane, to remove heat. R 1:N low loss power dividers route the amplified RF signals to R*N radiating elements. Each of the 1:N power dividers suitably reside in the X-Z plane and are stacked in the Y direction to provide a planar output of the R*N radiating elements in the Y-Z plane. Placement of the amplifier chips on the single submodule decouples the number of amplifier chips, hence output power, from the number of radiating elements. Placement of the amplifier chips away from the radiating face provides a short path with large thermal cross-section through the heat sink to the backplane to remove heat. The topology can produce high output power combined with a high antenna gain to produce large power-aperture products previously only achievable with a Gyrotron. As amplifier chips become more powerful, the topology can be adapted to use fewer chips.

18 Claims, 11 Drawing Sheets

U.S. PATENT DOCUMENTS

| | | | |
|---|---|---|---|
| 5,481,223 A | 1/1996 | Wong | |
| 5,515,009 A | 5/1996 | Wong | |
| 5,736,908 A | 4/1998 | Alexanian | |
| 5,920,240 A | 7/1999 | Alexanian | |
| 6,130,640 A | 10/2000 | Uematsu | |
| 6,188,373 B1* | 2/2001 | Martek | 343/893 |
| 6,239,764 B1 | 5/2001 | Timofeev | |
| 6,525,650 B1* | 2/2003 | Chan et al. | 340/14.69 |
| 6,542,662 B2 | 4/2003 | Cheung | |
| 6,559,724 B2 | 5/2003 | Rosenberg | |
| 6,765,535 B1 | 7/2004 | Brown | |
| 6,876,272 B2 | 4/2005 | Delisio, Jr. | |
| 7,215,220 B1 | 5/2007 | Jia | |
| 7,391,382 B1 | 6/2008 | Mason | |
| 7,839,350 B2* | 11/2010 | Nagai | 343/850 |
| 2006/0077102 A1* | 4/2006 | Mohamadi | 343/700 MS |
| 2006/0202777 A1 | 9/2006 | Deckman | |
| 2006/0203757 A1* | 9/2006 | Young et al. | 370/315 |
| 2010/0072829 A1* | 3/2010 | Mason et al. | 307/149 |

FOREIGN PATENT DOCUMENTS

| | | |
|---|---|---|
| EP | 0448318 B1 | 5/1996 |
| EP | 1151317 B1 | 3/2005 |
| EP | 1301966 B1 | 8/2006 |
| GB | 2225170 A | 5/1990 |

OTHER PUBLICATIONS

Harvey, Spatial power combining for high power amplifiers, Dec. 2000.

Jai, Design of waveguide finline arrays for spatial power combining, Apr. 2001.

Sowers, A 36 Watt, V-band, Solid State Source, 1999.

Mailloux, Antenna Array Architecture, Jan. 1992.

\* cited by examiner

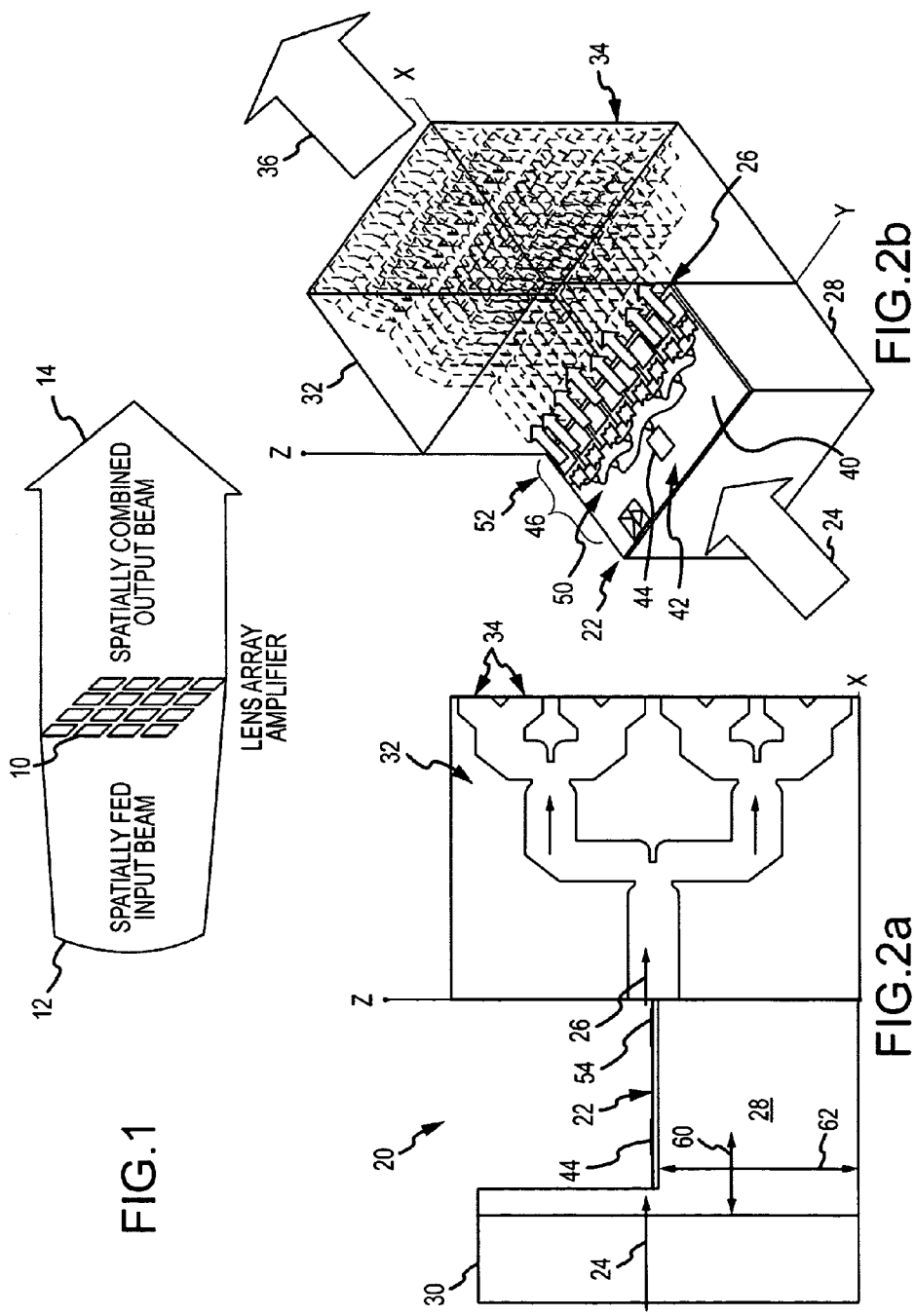

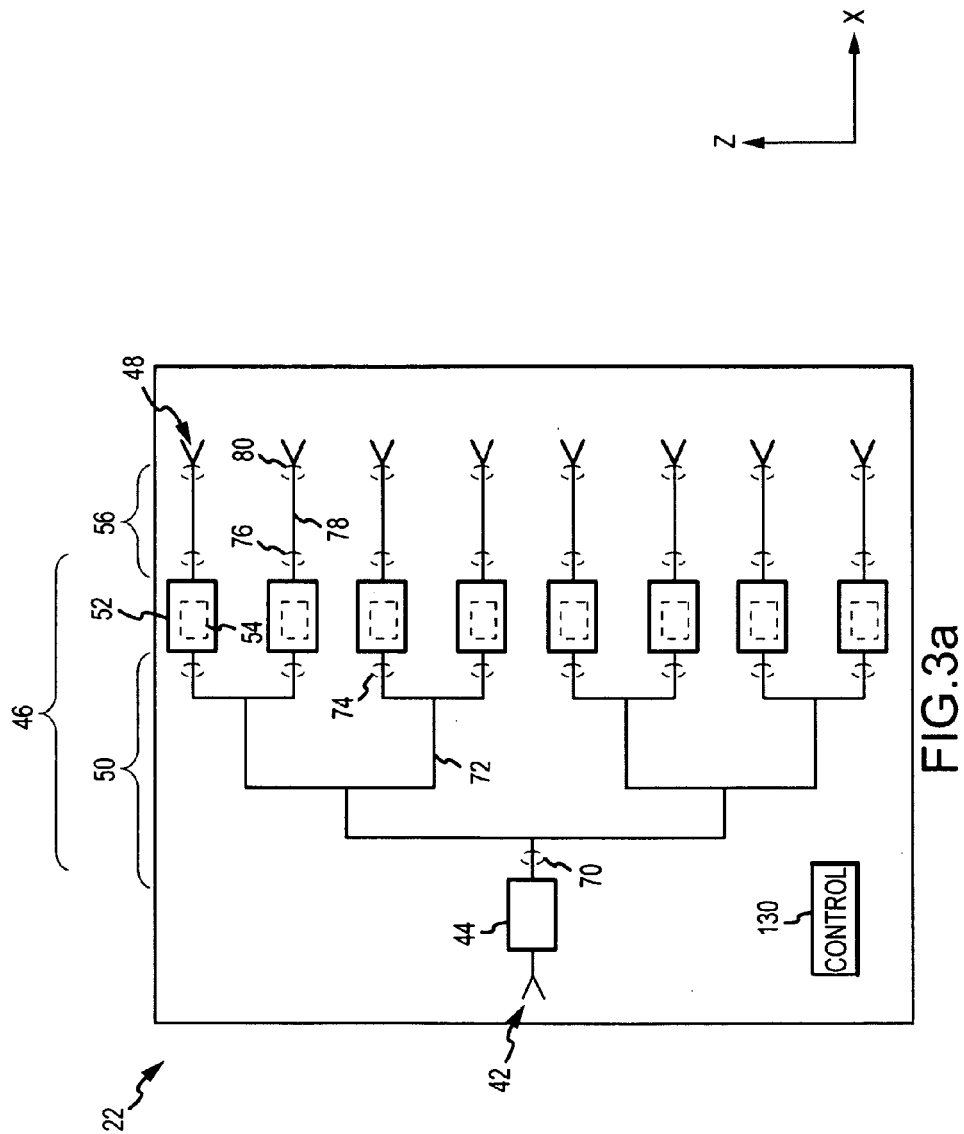

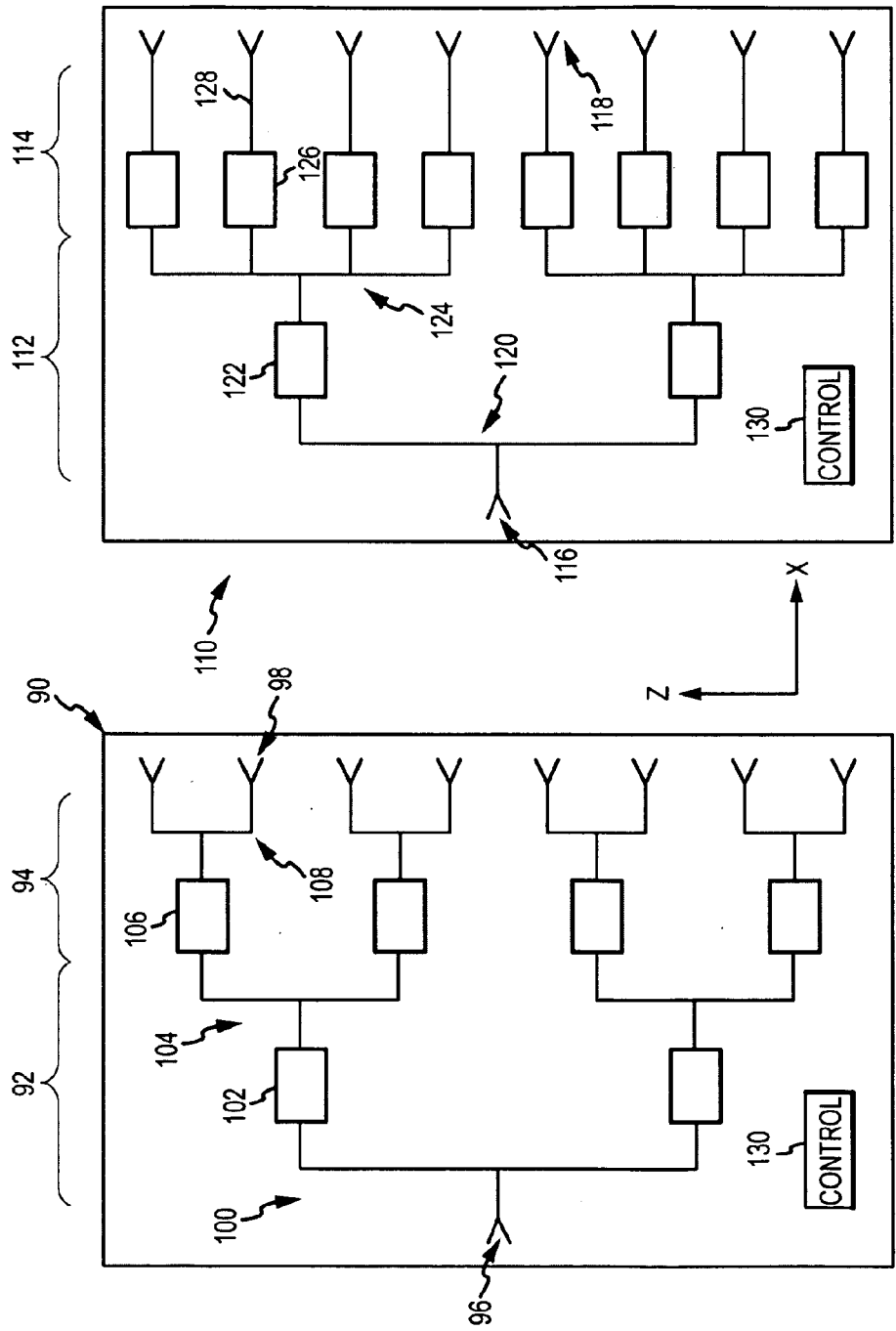

US 8,107,894 B2

MODULAR SOLID-STATE MILLIMETER WAVE (MMW) RF POWER SOURCE

RELATED APPLICATION INFORMATION

This application claims benefit of priority under 35 U.S.C. 119(e) to U.S. Provisional Application Nos. 61/088,073 entitled "Methods and Apparatus for Low Power Solid State Module" filed on Aug. 12, 2008, the entire contents of which are incorporated by reference.

This patent is related to copending application Ser. No. 12/237,312 entitled "Lens Array Module" filed Sep. 24, 2008 and copending application Ser. No. 11/841,580 entitled "Modular MMW Power Source" filed Aug. 20, 2007.

BACKGROUND OF THE INVENTION

1. Field of the Invention

This invention relates to solid-state sources for millimeter wave (MMW) RF power, and to high power sources for W-band applications in particular.

2. Description of the Related Art

Sources of medium and high power, MMW radiation can be applied in communications systems and in directed energy weapons. While lower frequency MMW wave applications can now be satisfied with solid-state sources, high power sources for the W-band (75 GHz to 110 GHz) traditionally incorporate tubes such as magnetrons or Gyrotrons. Gyrotrons are effective because the large output power is combined with a very high gain antenna to produce a large power-aperture. However, such tubes are expensive, bulky, fragile, and require high voltage electrical power. Thus MMW sources incorporating tubes are not readily portable.

Semiconductor devices are now available for use as oscillators or amplifiers in the W-band, but the available power output from each semiconductor device may be limited to no more than a few watts. Thus medium and high power solid state W-band sources may use quasi-optical methods that combine the power output from a large plurality of semiconductor devices within a waveguide or in free space. Approaches that have been suggested for combining the power output from plural semiconductor devices include the reflect array amplifier described in U.S. Pat. No. 6,765,535, the grid array amplifier described in U.S. Pat. No. 6,559,724, and the lens array or tray amplifier described in U.S. Pat. No. 5,736,908.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a modular solid-state MMW power source built around a solid-state amplifier chip that decouples the number of amplifier chips, hence power, from the size of the array of radiating elements and improves thermal management of the heat generated by the amplifier chips. The topology can produce high output power combined with a high antenna gain to produce large power-aperture products previously only achievable with a Gyrotron.

An embodiment of a modular solid-state MMW power source includes a single submodule that uses one or more power dividers and one or more solid-state amplification stages to divide and amplify an RF input signal into R amplified RF signals. The submodule is mounted (suitably in the X-Y plane) on the surface of a heat sink, suitably coupled to a cold backplane, to remove heat. R 1:N low loss power dividers route the amplified RF signals to R*N radiating elements. Each of the 1:N power dividers suitably reside in the X-Z plane and are stacked in the Y direction to provide a planar output of the R*N radiating elements in the Y-Z plane. Placement of the amplifier chips on the single submodule decouples the number of chips, hence output power from the number of radiating elements. Placement of the amplifier chips away from the radiating face provides a short path with large thermal cross-section through the heat sink to the backplane to remove heat.

In an embodiment, the submodule includes an input antenna, a first power amplification stage and R output antennas. The first power amplification stage includes a 1:M1 power divider with an input coupled to the input antenna, M1 circuit devices, each including a solid-state amplifier chip, and M1 1:M2 power dividers with outputs coupled to the R output antennas. The submodule may include a second power amplification stage that includes M1*M2 circuit devices and M1*M2 1:M3 power dividers with outputs coupled to one of the R output antennas. The configuration of power dividers and circuit devices provides flexibility for selecting the number of amplifier chips and configuring the functionality of the circuit devices. As amplifier chips become more powerful, the topology can be adapted to use fewer chips without reducing the number of radiating elements.

In an embodiment, the submodule power dividers are preferably strip-lines that route the RF signals along conductive transmission paths and the R 1:N power dividers are preferably waveguides that route the amplified RF signals along free-space transmission paths. Strip-lines are easier and less expensive to manufacture and couple easily to the solid-state amplifier chips. Waveguides are more difficult to manufacture but have less loss than strip-lines.

These and other features and advantages of the invention will be apparent to those skilled in the art from the following detailed description of preferred embodiments, taken together with the accompanying drawings, in which:

BRIEF DESCRIPTION OF THE DRAWINGS

FIG. 1 is a diagram of a lens army amplifier;

FIGS. 2a through 2c are side, perspective and exploded views of an embodiment of a modular solid-state MMW power source in accordance with the present invention;

FIGS. 3a through 3c are schematic diagrams of different configurations of the submodule;

DETAILED DESCRIPTION OF THE INVENTION

As shown in FIG. 1, the modular solid-state MMW power source of the present invention is a type of lens array amplifier. In general, a lens array amplifier 10 receives a spatially fed RF beam 12, divides the beam into channels and amplifies each channel using a solid-state amplifier chip to feed an array of radiating elements that spatially combine the amplified RF beams into a radiated RF beam 14. The array topology allows for the use of multiple amplifier chips, which together can provide the desired output power. Compared to the reflective topology, the lens array reduces chip material, hence reduces cost and the array of radiating elements can be more tightly spaced. Previous topologies of the lens array amplifier co-locate each amplifier chip with a radiating element. As a result, the number of amplifier chips is dictated by the size of the radiating array. Furthermore, the amplifier chips are packed in a dense array near the radiating face. These topologies are configured to provide maximum output power. However, these topologies do not allow for efficient scaling of the output power and they complicate thermal management.

The present invention provides a modular solid-state MMW power source based on a topology of the lens array amplifier that provides both the flexibility to scale output power and effective thermal management. The modular power source includes a heat sink, suitably coupled to a cold backplane, a single submodule on the heat sink that uses one or more power dividers and one or more solid-state amplification stages to divide and amplify an RF input signal into a plurality of amplified RF signals and a like plurality of low loss power dividers that route the amplified RF signals to a planar array of radiating elements. The modular power source is generally applicable for all MMW applications, but may have particular applicability in the K-band (18-27 GHz), Ka-band (27-40 GHz), V-band (40-75 GHz), W-band (75-110 GHz) and the mm-band (110-300 GHz). Placement of the amplifier chips on the single submodule decouples the number of amplifier chips, hence output power, from the number of radiating elements. Placement of the amplifier chips away from the radiating face provides a short path with large thermal cross-section through the heat sink to the backplane to remove heat. Efficient thermal management allows the power source to be operated at higher duty cycles. The topology can produce high output power combined with a high antenna gain to produce large power-aperture products previously only achievable with a Gyrotron. As amplifier chips become more powerful, the topology can be adapted to use fewer chips.

Figure 2C:
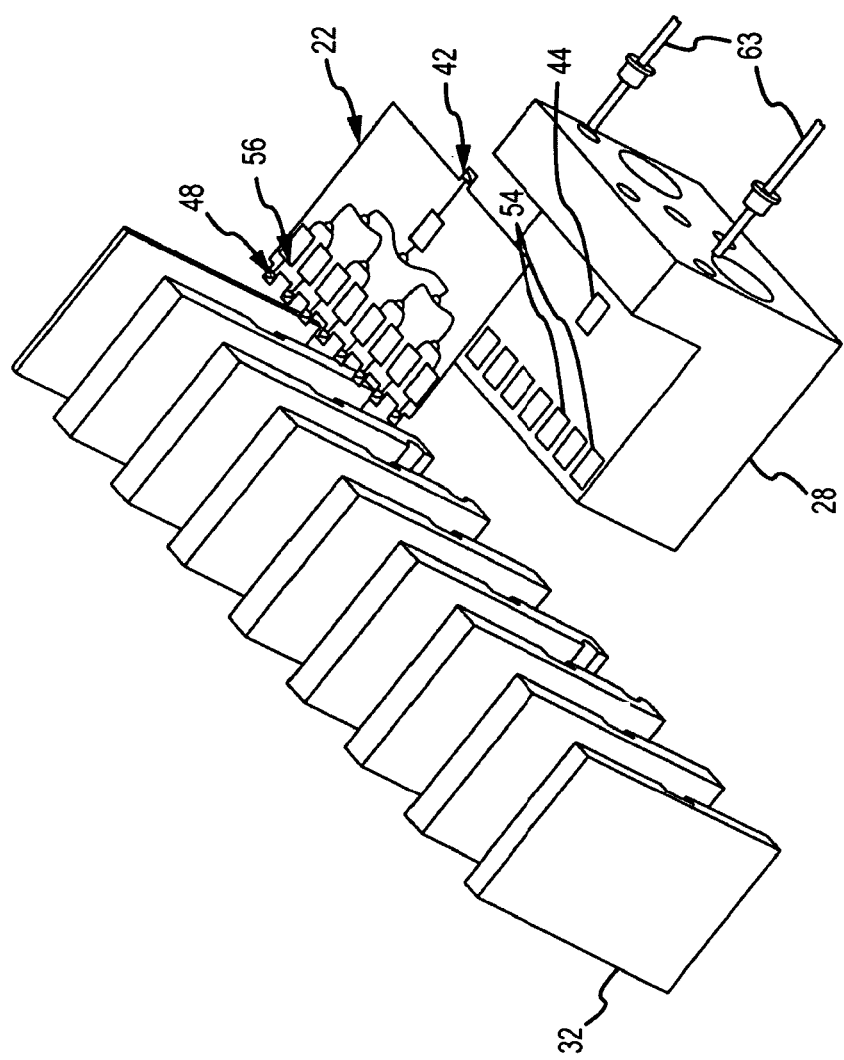

Referring now to FIGS. 2a through 2c, an embodiment of a modular solid-state MMW power source 20 includes a single submodule 22 that divides and amplifies an RF input signal 24 into R amplified RF signals 26. The submodule is mounted on the surface of a heat sink 28, which is suitably coupled to a "cold" backplane 30 to remove heat from the submodule. R 1:N low loss power dividers 32 route the amplified RF signals 26 to R*N radiating elements 34 that produce a spatially combined amplified RF output signal 36. Submodule 22 may be mounted on the generally planar surface of heat sink 28 suitably in the X-Y plane. Each of the R 1:N power dividers 32 suitably reside in the X-Z plane and are stacked in the Y direction to provide a planar output of the R*N radiating elements 34 in the Y-Z plane.

Submodule 22 may comprise a generally planar substrate 40 supporting an input antenna 42, a solid-state pre-amplifier chip 44, at least one amplification stage 46, and R output antennas 48. The first power amplification stage 46 includes a 1:M1 power divider 50 with an input coupled to the input antenna (through the pre-amp), M1 circuit devices 52, each including a solid-state amplifier chip 54, and M1 1:M2 power dividers 56 with outputs coupled to the R output antennas. M1 and M2 are integers, typically a power of two. At least one of M1 or M2 is an integer greater than one. R is an integer greater than one, typically a power of two. For a single stage, R=M1*M2 and the number of devices D=M1. The submodule may include a second power amplification stage (between the first stage and the R output antennas) that includes M1*M2 circuit devices and M1*M2 1:M3 power dividers with outputs coupled to one of the R output antennas. M3 is an integer, typically a power of two. For a two-stage submodule, R=M1*M2*M3 and D=M1+(M1*M2).

Power dividers 50 and 56 are suitably strip-lines that route the RF signals along conductive transmission paths. A strip line may be formed by printing a conductive trace on the surface of the substrate above a conductive ground plane. Strip-lines are easy and inexpensive to manufacture and couple easily to the solid-state amplifier chips. Input antenna 42 may be printed on the substrate and configured to receive RF input signal 24 from a waveguide and couple the signal to the input of strip-line power divider 50. R output antennas 48 may be printed on the substrate and configured to receive amplified RF signals 26 from respective outputs of strip-line power divider 56 and couple the signals to respective waveguides.

Heat sink 28 provides a short thermal path 60 with a large cross-section 62 from the circuit devices 52, and in particular the solid-state amplifier chips 54, to back plane 30 to remove heat. Amplifier chips 54 may be mounted on the surface of the substrate or directly on the surface of the heat sink through holes in the substrate. The short thermal path 60 is a result of spacing the amplifier chips away from the face of the radiating elements 34. The large cross-section 62 is a result of having a single submodule 22. Rather than packing the amplifier chips in a dense array, the chips are mounted on a planar surface on the heat sink. Heat sink 28 can have a thickness of approximately one-half the thickness of output power dividers 32 in the Z-dimension. The increased thickness and mass provide a much larger cross section to remove heat. The heat sink may be a large conductive block such as formed from, for example, solid metal or thermal pyrolytic graphite (TPG). Alternately, the thickness of the heat sink allows for passages adapted to circulate a fluid coolant. Feedthroughs 63 route DC bias signals to the submodule.

Thermal management is enhanced by coupling heat sink 28 to a "cold" backplane 30. The module could be configured without the backplane and simply radiate heat from the heat sink. However, the cold backplane draws heat from the heat sink thereby enhancing overall heat transfer. The backplane may be made "cold" in different ways. Heat may be passively or actively removed from the backplane to reduce its temperature. Alternately, a system for circulating fluid coolant through passages in the heat sink may be provided. Backplane 30 also provides means to couple the RF input signal to the input antenna on the submodule and means to route DC power to the submodule.

The R 1:N power dividers 32 are suitably waveguides that route the amplified signals 26 along free-space transmission paths. Waveguides are more difficult to manufacture but have less loss than strip-lines, perhaps a factor of ten or more (measured in dB). It is important that the transmission paths after the amplifier chips 54 are low loss for two reasons. First, low loss is needed to maintain the overall efficiency of the power source. Second, low loss is needed to keep the heat generated in the stack of power dividers at a minimum. The path length is long and the cross-section small to remove heat generated in power dividers 32. In the described embodiment, no additional heat sinks are provided for power dividers 32. The power dividers must be closely spaced as dictated by the MMW operating wavelength.

Referring now to FIGS. 3a through 3c, placement of submodule 22 away from the face of the radiating elements decouples the number of circuit devices, and in particular amplifier chips, from the number R*N of radiating elements. The number, placement and functionality of the circuit devices can be controlled through selection of the number of power amplification stages e.g. 1 or 2, and the construction of the power dividers in each stage. This topology is flexible enough to accommodate several design goals. First, the module may be constructed to provide a specified amount of total power in the output beam; not necessarily the maximum amount of total power. Second, the module may be configured to provide the specified total power with the minimum number of amplifier chips possible given the current state of chip technology e.g. maximum power per chip, to minimize cost. Third, the chips may be operated at their maximum power and efficiency to maintain overall efficiency. Unlike previous topologies, the number of circuit devices can be scaled back to provide less than maximum total power while still operating each device at its maximum efficiency. Furthermore, as the power output capabilities of each devices increases, the number of circuit devices can be scaled back to provide the same total power.

Referring now to FIG. 3a, submodule 22 (as shown in FIGS. 2a-2c) includes input antenna 42, pre-amplifier chip 44, a single amplification stage 46 and R output antennas 48 formed on substrate 40. The amplification stage includes a 1:8 strip-line power divider 50, 8 circuit devices 52, each including an amplifier chip 54, and 8 1:1 strip-line power dividers 56. Power divider 50 includes a strip-line input 70 coupled to input antenna 42 (via pre-amp chip 44) and strip-line transmission paths 72 that route the RF signal to 8 strip-line outputs 74 coupled to the respective circuit devices. Each power divider 56 includes a strip-line input 76, a strip-line transmission path 78 and a strip-line output 80 to route the amplified RF signal from a circuit device 52 to its output antenna 48.

In this construct, M1=8, M2=1 and R=M1*M2=8. The total number of circuit devices D=M1=8 (ignoring the pre-amp). As shown in FIG. 2b, each amplified RF signal 26 is coupled to a 1:8 waveguide power divider 32 for a total of 8*8=64 radiating elements 34. Thus, 8 circuit devices (e.g. 8 amplifier chips) power an array of 64 radiating elements. If the total power requirements are lower or the output power of the amplifier chips increases, the number of circuit devices can be reduced. For example, if power divider 50 is 1:4 and power divider 56 is 1:2 than only 4 amplifier chips are used. The maximum number of circuit devices D in a submodule with a single amplification stage is R and the minimum is one.

If additional power or functionality is required, the submodule may be configured with first and second amplification stages. In this case the maximum number of circuit devices D is 2*R. Two amplification stages also provide some flexibility to alter the functionality of the circuit devices in the first and second stages. Each circuit device will include an amplifier chip but may include other circuit elements as described below in FIG. 4.

Referring now to FIG. 3b, a submodule 90 includes first and second power amplification stages 92 and 94, respectively, that divide and amplify an RF signal received at input antenna 96 and route it along strip-line transmission paths to the R=8 output antennas 98. The first power amplification stage 92 includes a 1:2 strip-line power divider 100, a pair of circuit devices 102 and a pair of 1:2 strip-line power dividers 104 (M1=2 and M2=2). The second power amplification stage 94 includes four circuit devices 106 and four 1:2 strip-line power dividers 108 (M3=2). In this construct, M1=2, M2=2, M3=2 and R=8. The total number of circuit devices D=M1+(M1*M2)=6.

Referring now to FIG. 3c, a submodule 110 includes first and second power amplification stages 112 and 114, respectively, that divide and amplify an RF signal received at input antenna 116 and route it along strip-line transmission paths to the R=8 output antennas 118. The first power amplification stage 112 includes a 1:2 strip-line power divider 120, a pair of circuit devices 122 and a pair of 1:4 strip-line power dividers 124 (M1=2 and M2=4). The second power amplification stage 114 includes eight circuit devices 126 and eight 1:1 strip-line power dividers 128 (M3=1). In this construct, M1=2, M2=4, M3=1 and R=8. The total number of circuit devices D=M1+(M1*M2)=10.

Each submodule may also include other circuitry represented by control circuitry 130. Control circuitry 130 may provide signals to control phase shifters and/or amplitude adjusters within the circuit devices. Control circuitry 130 may include a microcontroller or other processor to receive instructions from external to the power source module and to generate the control signals. Control circuit 130 may scale and distribute the DC power signals external to the power source module to power the circuit devices.

Figure 4:
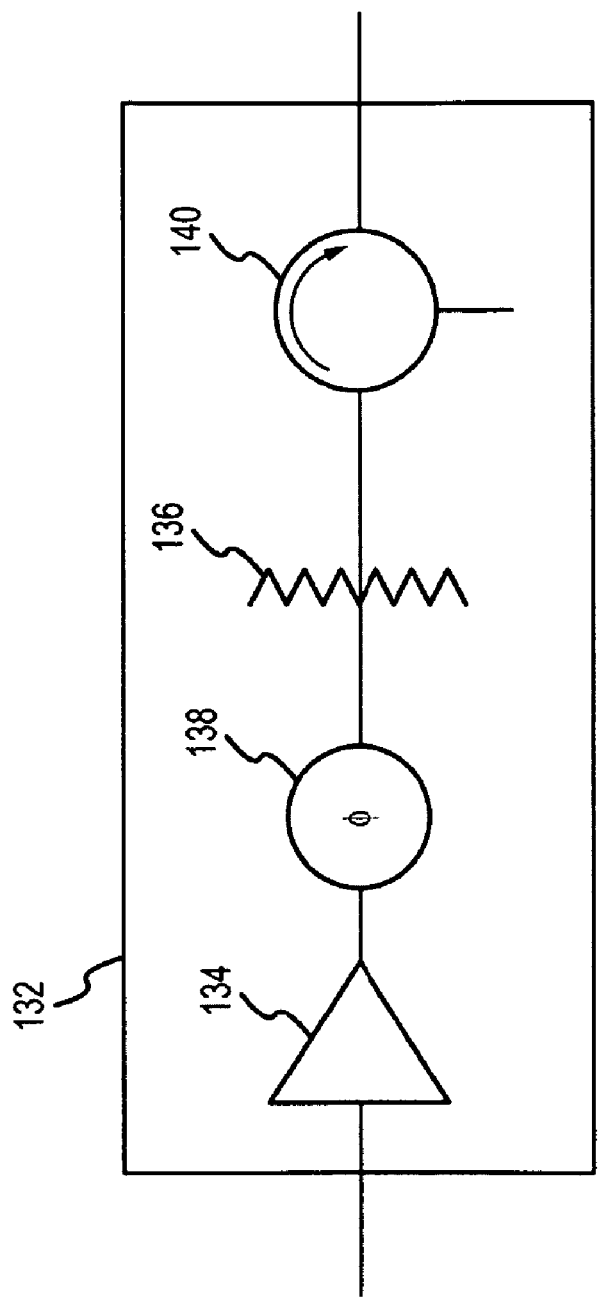
FIG. 4 is a schematic diagram or the circuit device including a MWM amplifier chip.

Referring to FIG. 4, each circuit device 132 includes a solid-state amplifier chip 134 to amplify the band corresponding to the RF input signal. Amplifier chips include high electron mobility transistors (HEMT), well-known in the art of high-frequency devices, to amplify MMW RF signals, particularly in the W-band. Gallium-Nitride (GaN), Gallium-Arsenide (GaAs) and Indium-Phosphide (InP) technologies are examples of HEMT devices. The GaN chip includes a base layer formed from Silica Carbide. This layer is an electrical insulator and thermal conductor. Amplifier chips using the other technologies may also exhibit a similar base layer composition. The HEMT chip can be mounted directly on the heat sink for efficient heat removal. An embodiment of an amplifier chip is described in co-pending U.S. application Ser. No. 12/266,299 entitled "Millimeter Wave Monolithic Integrated Circuits and Methods of Forming Such Integrated Circuits" filed Nov. 6, 2008, the entire contents of which are incorporated by reference. Each transistor in the amplifier stages is a HEMT.

Each circuit device 132 may also include other circuit elements. The device may include an amplitude adjuster 136, a phase shifter 138 or a circulator 140. Each circuit device may include one or more of an RF switch, a circulator, and a low noise amplifier (none of which are shown in FIG. 4) in which case the power source module may have a capability to function as a receiver as well as a power source. The amplitude adjuster 136 may be a variable attenuator, a variable gain amplifier stage within or in addition to amplifier 134, or some other gain adjusting device. The amplitude adjuster 136, the phase shifter 138 and the amplifier 134, may be separate devices or components, or may be completed or partially implemented in one or more monolithic microwave integrated circuits. The circuit devices on any submodule may be identical or may be different. In an alternate embodiment, the circuit devices may not include an amplifier chip, they may include only amplitude adjusters or phase shifters to alter the RF signal.

Figure 5A:
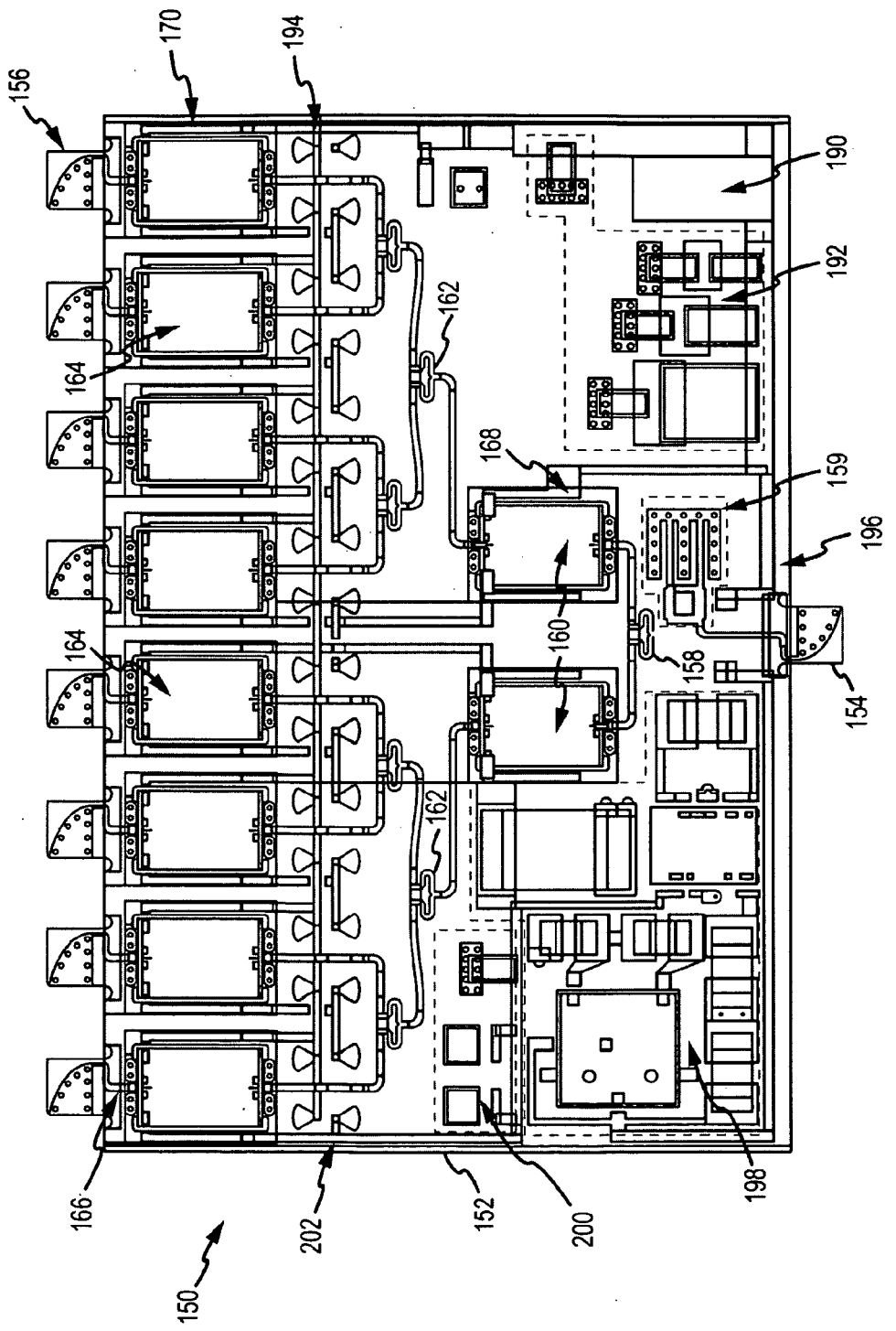
FIGS. 5a and 5b are a diagram of the submodule illustrated in FIG. 3c and a detailed diagram of the wire bonds to an individual chip, respectively.
Figure 5B:
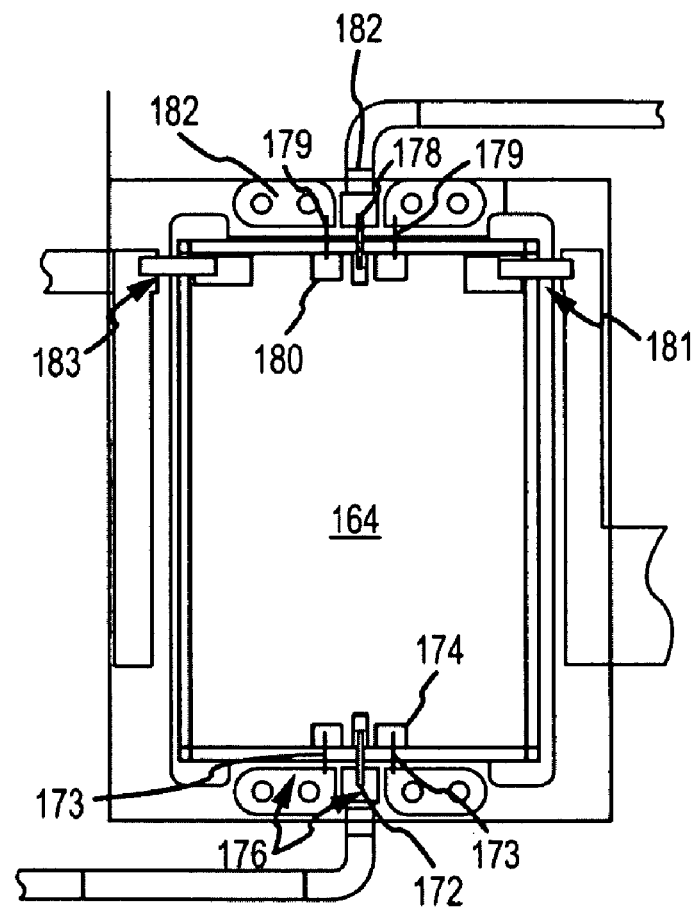

A submodule 150 having the topology of the submodule 110 shown in FIG. 3c is shown in detail in FIGS. 5a and 5b. Submodule 150 includes a generally rectangular dielectric substrate 152 having parallel front and back surfaces. The dielectric substrate 152 may be fabricated of alumina, beryllia, aluminum nitride, or other dielectric material suitable for use at the frequency of operation of the power source module. The dielectric substrate 152 may be a laminate and include a conductive ground plane towards the back surface.

Submodule 150 includes an input antenna 154 and eight output antennas 156 formed of conductive traces printed on the front surface of the substrate. In this implementation, the antennas are ¼ circle or half-Vivaldi antennas. Input antenna 154 couples a free-space RF signal from a waveguide into a strip-line. Conversely, output antenna 156 couples an RF signal propagating in a strip-line to a free-space waveguide.

Submodule 150 includes a first amplification stage comprising a 1:2 power divider 158 coupled to a phase shifter 159, which is coupled to input antenna 154, a pair of amplifier chips 160 and a pair of 1:4 power dividers 162 and a second amplification stage comprising eight amplifier chips 164 and eight 1:1 power dividers 166 coupled to the eight output antennas 156. The power dividers are formed of conductive traces printed on the front surface of the substrate. The traces spaced apart from the conductive back plane by the dielectric substrate define the respective strip-lines. The RF signals travel in the conductive traces across the substrate and are split into approximately equal signals by the power dividers.

The amplifier chips 160 and 164 are placed in rectangular openings 168 and 170, respectively, in the substrate 152 and mounted directly on the surface of the underlying heat sink. As shown in FIG. 5b, jumper wires (wire bonds) 172, 173 provide electrical contact between input pads 174 on the chips and output pads 176 at the ends of the power dividers. Jumper wires (wire bonds) 178, 179 provide electric contact between output pads 180 on the chips and inputs pads 182 at the inputs to the next power divider. For the RF signal there are three jumper wires at the input and the output. The center jumper wire 172 and 178 connects the RF path and the two outside jumper wires 173 and 179 are grounds. The ground pads on the substrate have vias connecting to the ground plane of substrate. A wire bond 181 connects the drain voltage to the chip and a wire bond 183 connects the gate voltage to the chip.

DC power is connected to the submodule 150 at the pad 190. The DC power is conditioned by the filter 192. A conductive path 194 routes the drain voltage to the amplifier chips 164. An additional conductive path 196 sends the DC power to a charge pump 198, which inverts the polarity of the DC power and converts it to a suitable voltage level for the gate of the amplifier chips 164. The output from the charge pump 198 is conditioned by the filter 200 and then sent via a conductive path 202 to the gate of each amplifier chip.

Figure 6B:
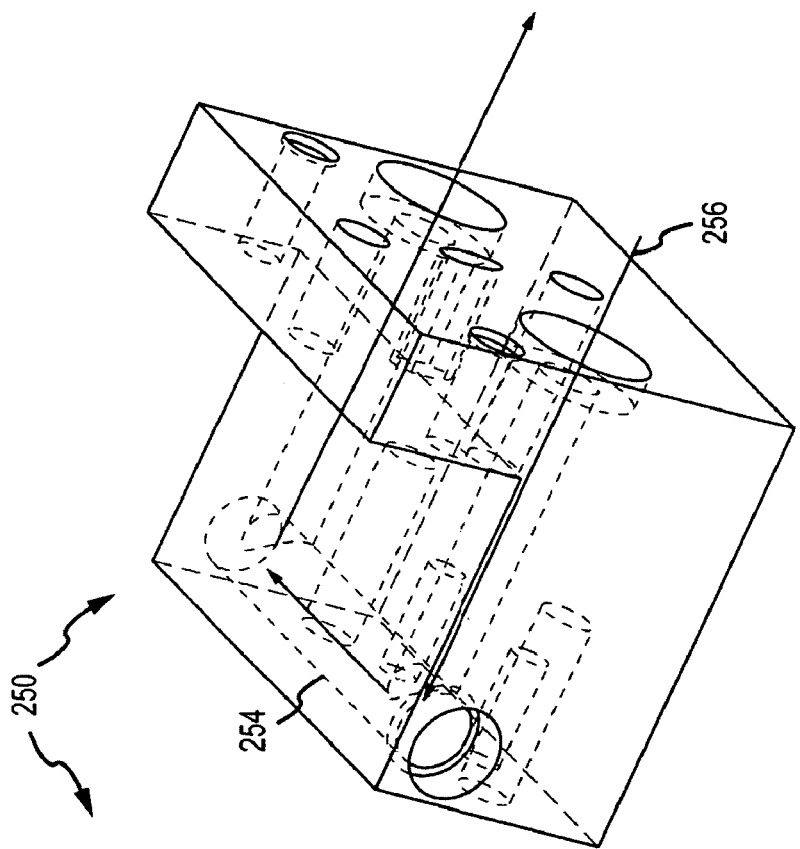
FIGS. 6a and 6b are a perspective and an internal view of an alternate embodiment of the heat sink including coolant lines.
Figure 6A:
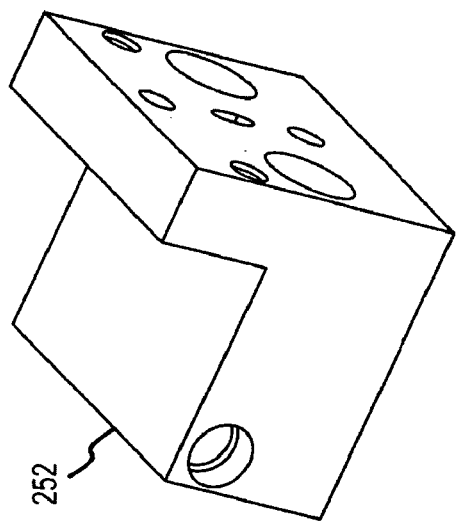

Referring now to FIGS. 6a and 6b, a heat sink 250 includes a block 252 form of a thermally conductive material and formed with passages 254 adapted to circulate a fluid coolant 256. Heat generated by the amplifier chips is transferred through the block material to the fluid coolant and removed to the back plane. The coolant fluid may be, for example, a gas or a liquid. While the passages 254 are shown as simple circular openings in FIG. 6b, the passages may include fins, vanes, posts and other structures. Such structures may be incorporated to increase the surface area exposed to the flowing coolant and/or to increase the turbulence of the coolant to improve the efficiency of heat transfer from the metal structures to the coolant. The thickness of block 252, approximately ½ the Z-dimension of the array of radiating elements, is sufficient to implement such passages to circulate coolant.

Figure 7B:
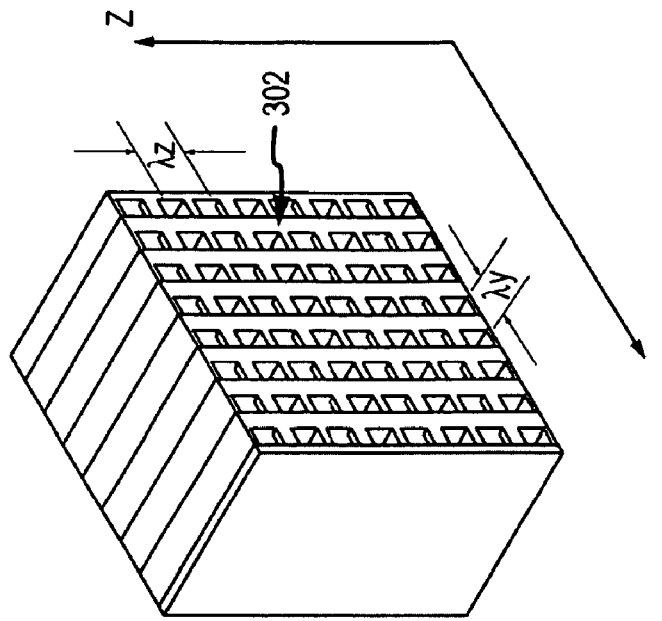
FIGS. 7a and 7b are views of a 1:8 waveguide power divider and a perspective end view of the 8:8 array of free-space radiating elements of the stack of waveguide power dividers.
Figure 7A:
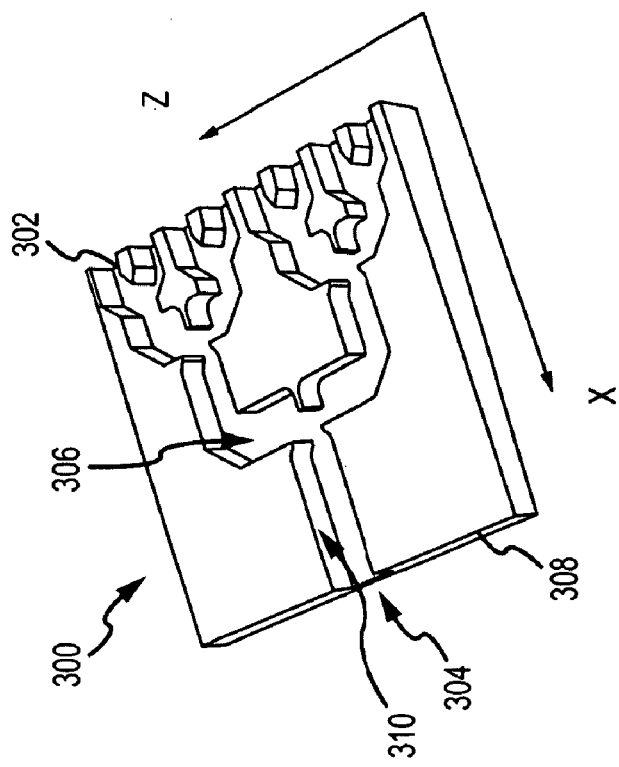

FIGS. 7a and 7b show a section view of a 1:8 waveguide power divider 300 residing in the X-Z plane and a perspective view of the 8×8 array of free-space radiating elements 302 in the Y-Z plane formed by a stack of 8 waveguide power dividers 300 in the Y direction. Each waveguide power divider 300 includes a free-space input 304, a plurality (N=8) of free-space transmission paths 306 and N free-space outputs that provide the radiating elements 302 in a block of material 308. The free-space input, transmission paths and outputs are surrounded by conductive walls 310 in the block 308 that define the free-space waveguide. The block 308 may be formed of a conductive material such as aluminum or formed of a non-conductive material such as plastic and plated with a conductive material such as gold. The loss (in dB) of a free-space waveguide is substantially less per unit length than the loss of a strip-line waveguide, may be a factor of ten or more e.g. 0.3 dB vs. 3 dB.

The array of free-space radiating elements 302 lie in a common Y-Z plane. The center-to-center spacing between the columns of radiating elements may be $\lambda y$, where $\lambda$ is the frequency of operation of the power source module and y is a constant typically between 0.5 and 1.0. The spacing between adjacent columns of elements may be exactly equal to the nominal spacing of $\lambda y$ or may deviate from the nominal spacing by a tolerance. The tolerance may be $\pm \lambda/10$ or some other tolerance. The constant y may be chosen such that the spacing between adjacent columns of radiating elements is from $0.5\lambda$ to $1.0\lambda$.

The center-to-center spacing between the rows of radiating elements may be $\lambda z$, where $\lambda$ is the frequency of operation of the power source module and z is a constant typically between 0.5 and 1.0. The spacing between adjacent rows of elements may be exactly equal to the nominal spacing of $\lambda z$ or may deviate from the nominal spacing by a tolerance. The tolerance may be $\pm \lambda/10$ or some other tolerance. The constant z may be chosen such that the spacing between adjacent rows of radiating elements is from $0.5\lambda$ to $1.0\lambda$. The constants x and y may be equal or unequal.

Figure 8B:
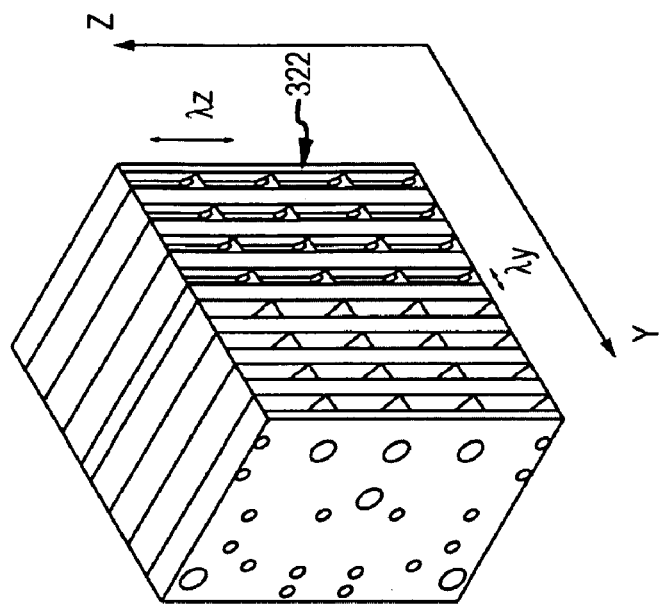
FIGS. 8a and 8b are views of a 1:4 waveguide power divider and a perspective of the 8:4 array of free-space radiating elements having the same footprint as the 8:8 array shown in FIG. 7b.
Figure 8A:
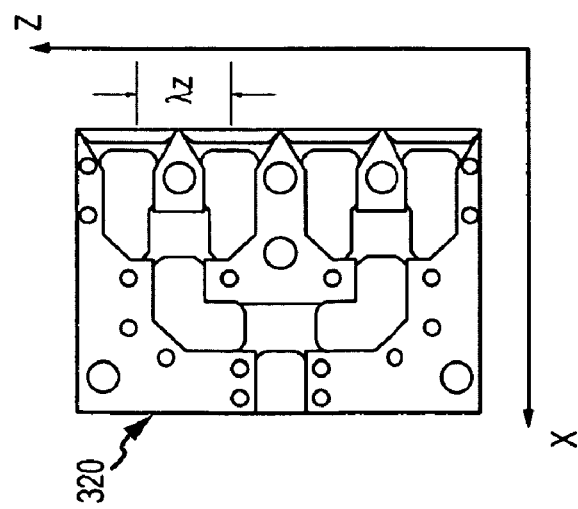

FIGS. 8a and 8b show a section view of a 1:4 waveguide power divider 320 residing in the X-Z plane and a perspective view of the 8×4 array of free-space radiating elements 322 in the Y-Z plane formed by a stack of 8 waveguide power dividers 320 in the Y direction. The center-to-center spacing along the Y-axis is the same as the above example and the center-to-center spacing along the Z-axis is twice that as the above so that the dimensions of the array of radiating elements are equivalent.

For example, an 8×8 array of radiating elements at an operating wavelength of 0.124 inches (95 GHz) produces a center-to-center spacing of 0.100 inches and a total size of 0.8×0.8 inches. This module has been demonstrated produce a spatially integrated beam of 8 Watts. The module may be configured to produce more power as amplifier chip technology progresses or less power as required by system considerations. The module produces a lot of power in a small volume. Decoupling the total power from the size of the array and effectively managing the thermal issues are important features of a spatial array topology for a modular solid-state MMW power source.

The radiated wavefronts from the plurality of radiating elements on the plurality of submodules may be spatially combined to provide an output wavefront (not shown) that differs from the input wavefront in amplitude, direction, or some other property. The spatially combined output wavefront may be radiated into free space or coupled into an output waveguide (not shown), a waveguide horn (not shown), or another device.

Figure 9:
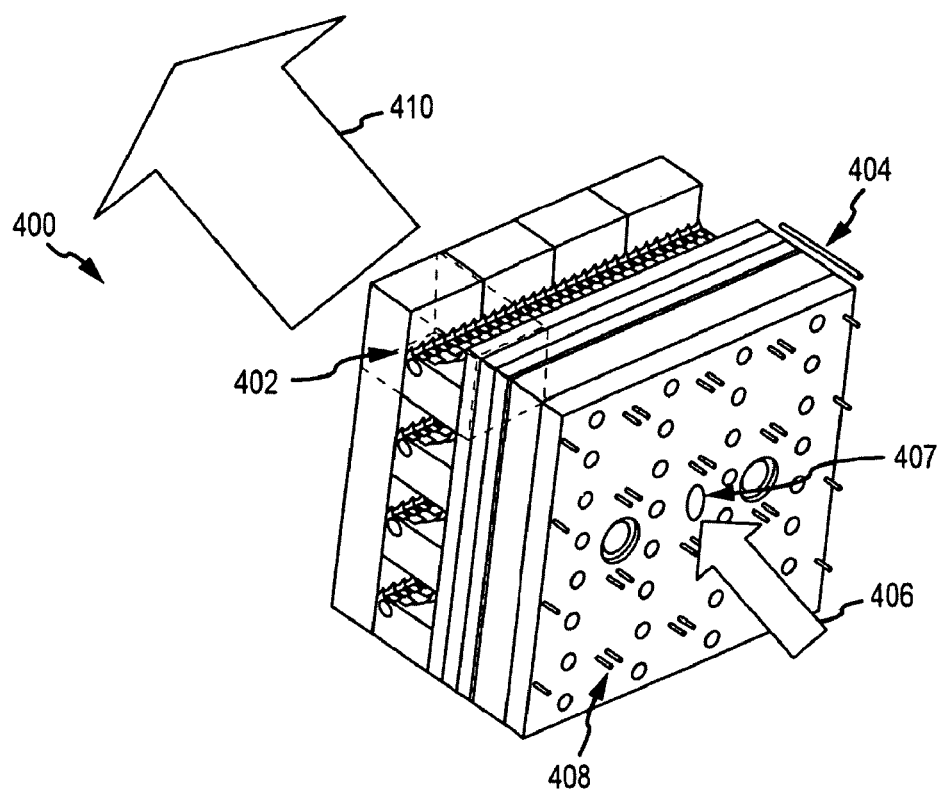
FIG. 9 is a perspective view of a 4×4 solid-state MMW power source coupled to a backplane.

FIG. 9 shows a solid-state MMW power source 400 comprised of a 4×4 array of modular solid-state MMW power sources 402 that share a common backplane 404. Each modular source 402 has an array of 8×8 radiating element. Power source 400 has an array of 32×32 radiating elements. No more than one row or column of radiating elements is absent at the boundary between adjacent juxtaposed modules. Backplane 404 receives an RF input signal 406 at a single port 407 in the center of the backplane, separates it into 4×4 RF signals and routes them to the input antennas of the respective modules. Backplane 404 also includes feedthroughs 408 for routing DC bias signals to each of the modules. Backplane 406 may also include means for independently circulating fluid coolant through the respective heat sinks for each of the modules. The amplified RF signals output by the 32×32 radiating elements may be spatially combined to form a high-power output beam 410.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A millimeter wave (MMW) power source module, comprising:
   a heat sink having a surface oriented in an X-Y plane;
   a submodule on the surface of the heat sink comprising;
      a substrate,
      an input antenna configured to receive an RF input signal from a waveguide and couple the signal to a strip-line,
      R output antennas configured to receive RF input signals from respective strip-lines and couple the signals to respective waveguides,
      a first power amplification stage comprising:
         a 1:M1 strip-line power divider, said power divider having one input coupled to receive the RF input signal from the input antenna and route the RF input signal along M1 conductive transmission paths to M1 output where M1 is an integer,
         M1 circuit devices, each circuit device having an input coupled to a corresponding one of the M1 outputs, a first stage solid-state amplifier chip that amplifies the RF input signal and a circuit output, and
         M1 1:M2 strip-line power dividers, each having one input coupled to one said circuit output to receive the amplified RF input signal and route the amplified RF input signal along M2 conductive transmission paths to M2 outputs coupled to one of the R output antennas where M2 is an integer, at least one of M1 or M2 being an integer greater than 1, and
      R 1:N waveguide power dividers, each power divider having one free-space input coupled to receive the free-space RF signal from one of the submodule's R output antennas and route the amplified RF input signal along N free-space transmission paths to N free-space radiating elements where N is an integer greater than 1, each said waveguide power divider residing in an X-Z plane and stacked in the Y direction to provide a planar output of R*N radiating elements in a Y-Z plane.

2. The MWM power source module of claim 1, wherein the heat sink has a thickness approximately equal to one-half the thickness of the waveguide power dividers in the Z dimension.

3. The MWM power source module of claim 1, further comprising:
   a backplane in thermal contact with the heat sink on the side opposite the R1:N waveguide power dividers.

4. The MWM power source module of claim 1, wherein the heat sink has passages adapted to circulate a fluid coolant.

5. The MWM power source module of claim 1, wherein the input antenna and R output antennas are printed on the substrate.

6. The MWM power source module of claim 1, wherein the amplifier chip amplifies the RF input in a band occupying a portion of a 18 GHz to 300 GHz spectrum.

7. The MWM power source module of claim 1, wherein the amplifier chip amplifies the RF input in a W band occupying a portion of a 75-110 GHz spectrum.

8. The MWM power source module of claim 1, wherein the amplifier chip is a Gallium-Nitride device.

9. The MWM power source module of claim 1, wherein the amplifier chip includes an electrically insulating and thermally conductive base layer, said substrate having holes for mounting the amplifier chips' base layer directly on the heat sink.

10. The MWM power source module of claim 1, wherein the module is adapted to be juxtaposed with a plurality of similar modules to provide a modular array, wherein
   the radiating elements of the modular array are disposed on a rectilinear grid in the Y-Z plane with the spacing between adjacent grid points substantially equal to $\lambda y$ on the Y axis and substantially equal to $\lambda z$ on the Z axis, where $\lambda$ is an operating frequency of the millimeter wave power source module and y and z are constants selected in the range from 0.5 to 1.0, and
   wherein no more than one row or column of radiating elements is absent at the boundary between adjacent juxtaposed modules.

11. The MWM power source module of claim 1, wherein the submodule further comprises a second power amplification stage between the first stage and the R output antennas, comprising:
   M1*M2 circuit devices, each circuit device having an input coupled to a corresponding one of the outputs of the M1 1:M2 power dividers, a second stage solid-state amplifier chip that amplifies the RF input signal and a circuit output;
   M1*M2 1:M3 power dividers, each having one input coupled to a circuit output to receive the amplified RF input signal and M3 outputs coupled to one of the R output antennas where M3 is an integer of 1 or greater.

12. The MWM power source module of claim 1, wherein the stack of R 1:N waveguide power dividers define a conductive block in which the free-space inputs, transmission paths and outputs have conductive walls for routing the amplified RF signal.

13. The MWM power source module of claim 1, wherein the free-space radiating element is the open end of the free-space transmission path.

14. The MWM power source module of claim 1, wherein the loss per unit length of the waveguide power divider is at least a factor of ten dB less than the loss per unit length of the strip-line power divider.

15. The MWM power source module of claim 1, wherein the R×N radiating elements are disposed on a rectilinear grid in the Y-Z plane with the spacing between adjacent pairs of radiating elements substantially equal to $\lambda y$ on the Y axis and substantially equal to $\lambda z$ on the Z axis, where $\lambda$, is an operating frequency of the millimeter wave power source module and y and z are constants selected in the range from 0.5 to 1.0.

16. The MWM wave power source module of claim 15, wherein the overall dimensions of the millimeter wave power source module, measured along the Y-Z grid are essentially equal to $R\lambda y$ by $N\lambda z$ or $R\lambda y$ by $(N+1)\lambda z$.

17. A millimeter wave (MMW) power source module, comprising:
- a heat sink;
- a submodule on the surface of the heat sink, said submodule comprising;
  - a substrate,
  - an input antenna,
  - R output antennas,
  - a first power amplification stage comprising:
    - a 1:M1 power divider having one input coupled to receive the RF input signal from the input antenna and route the RF input signal to M1 outputs where M1 is an integer of 1 or greater,
    - M1 circuit devices, each circuit device having an input coupled to a corresponding one of the M1 outputs, a first stage solid-state amplifier chip that amplifies the RF input signal and a circuit output, and
    - M1 1:M2 power dividers, each having one input coupled to one said circuit output to receive the amplified RF input signal and route the amplified RF input signal to M2 outputs coupled to one of the R output antennas where M2 is an integer of 1 or greater, at least one of M1 or M2 being an integer greater than 1, and
- R 1:N power dividers, each power divider having one input coupled to receive the RF signal from one of the submodule's R output antennas and route the amplified RF input signal to N radiating elements where N is an integer greater than 1, each said power divider residing in an X-Z plane and stacked in the Y direction to provide a planar output of R*N radiating elements in a Y-Z plane.

18. The MWM wave power source module of claim 17, wherein the submodule's power dividers comprise strip-lines and the R 1:N power dividers comprise free-space waveguides.

* * * * *